(12) United States Patent
Nakajima et al.

(10) Patent No.: US 9,685,333 B2
(45) Date of Patent: Jun. 20, 2017

(54) MANUFACTURING METHOD OF SILICON CARBIDE SEMICONDUCTOR DEVICE

(71) Applicant: FUJI ELECTRIC CO., LTD., Kawasaki-shi, Kanagawa (JP)

(72) Inventors: Tsunehiro Nakajima, Kawasaki (JP); Masanobu Iwaya, Kawasaki (JP); Fumikazu Imai, Kawasaki (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/017,576

(22) Filed: Feb. 5, 2016

(65) Prior Publication Data

US 2016/0155640 A1 Jun. 2, 2016

Related U.S. Application Data

(63) Continuation of application No. PCT/JP2014/071121, filed on Aug. 8, 2014.

(30) Foreign Application Priority Data

Aug. 8, 2013 (JP) ................................. 2013-164798

(51) Int. Cl.
| | | |
|---|---|---|
| H01L 21/04 | (2006.01) | |
| H01L 21/304 | (2006.01) | |
| H01L 21/306 | (2006.01) | |
| H01L 29/45 | (2006.01) | |
| H01L 29/66 | (2006.01) | |
| H01L 29/739 | (2006.01) | |
| H01L 29/78 | (2006.01) | |
| H01L 29/16 | (2006.01) | |

(52) U.S. Cl.
CPC ...... *H01L 21/0485* (2013.01); *H01L 21/0475* (2013.01); *H01L 21/304* (2013.01); *H01L 21/30625* (2013.01); *H01L 29/45* (2013.01); *H01L 29/66068* (2013.01); *H01L 29/7395* (2013.01); *H01L 29/7802* (2013.01); *H01L 29/1608* (2013.01)

(58) Field of Classification Search
CPC combination set(s) only.
See application file for complete search history.

(56) References Cited

U.S. PATENT DOCUMENTS

2009/0209090 A1\* 8/2009 Yokoyama .......... H01L 29/6606
438/476
2014/0183562 A1\* 7/2014 Kiyosawa ......... H01L 29/66068
257/77
2015/0361585 A1\* 12/2015 Aigo ................. H01L 21/02019
428/141

FOREIGN PATENT DOCUMENTS

| JP | 2003-243323 A | 8/2003 |
| JP | 2007-184571 A | 7/2007 |
| JP | 2007-201155 A | 8/2007 |

(Continued)

*Primary Examiner* — Mamadou Diallo
(74) *Attorney, Agent, or Firm* — Rabin & Berdo, P.C.

(57) ABSTRACT

A method of manufacturing a silicon carbide semiconductor device includes grinding a back surface of a semiconductor substrate formed of silicon carbide to reduce thickness thereof and provide an altered layer that is ground; removing by polishing or etching, the altered layer from the back surface; forming a nickel film on the back surface of the semiconductor substrate after removing the altered layer; heat treating the nickel film to forming a nickel silicide layer by silicidation; and forming a metal electrode on a surface of the nickel silicide layer.

6 Claims, 3 Drawing Sheets

(56) References Cited

FOREIGN PATENT DOCUMENTS

| | | |
|---|---|---|
| JP | 2008-053291 A | 3/2008 |
| JP | 2010-086999 A | 4/2010 |
| JP | 4539140 B2 | 9/2010 |
| JP | 4846445 B2 | 12/2011 |
| WO | WO-2012-049792 A1 | 4/2012 |

\* cited by examiner

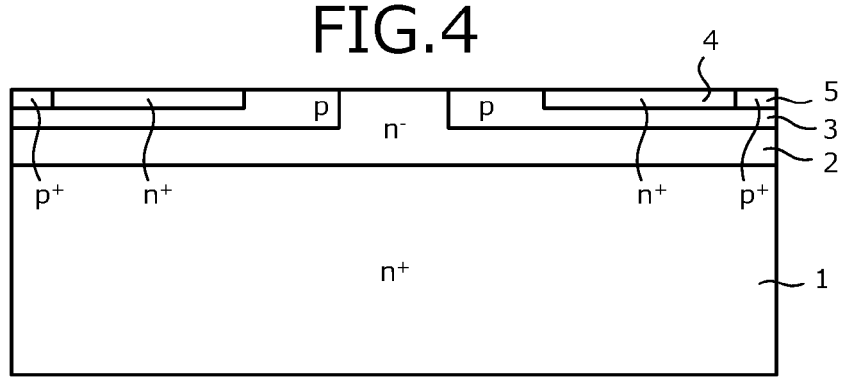
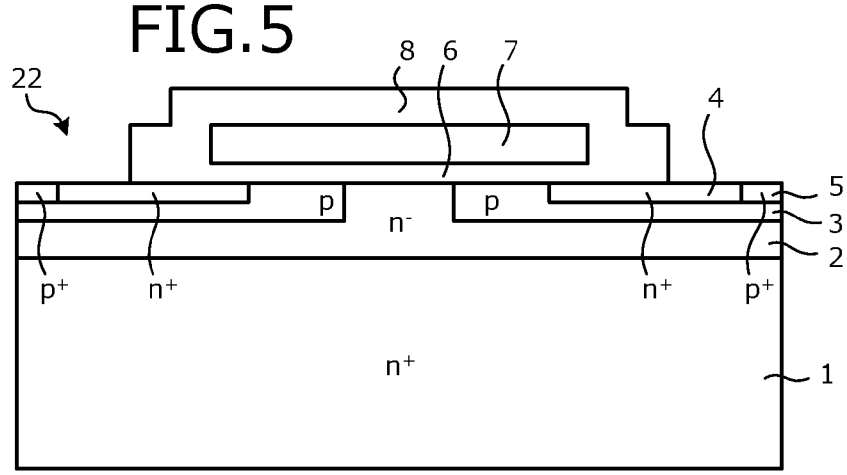
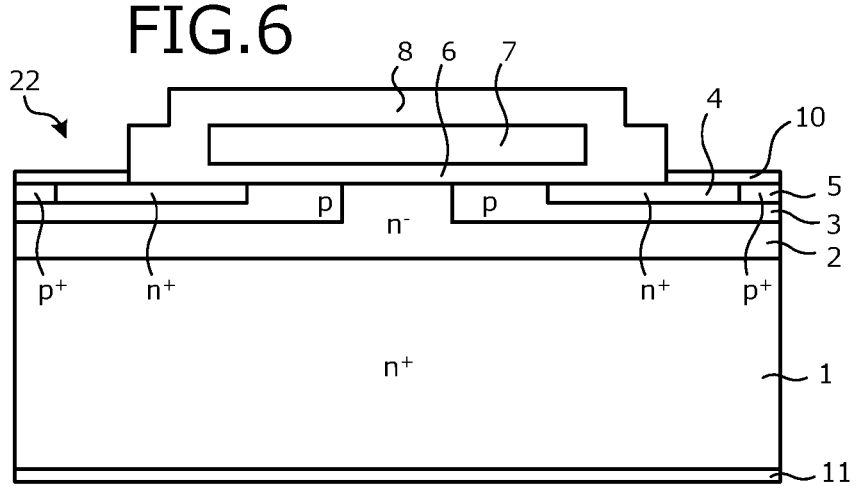

BACK SURFACE SIDE

BACK SURFACE SIDE

BACK SURFACE SIDE

MANUFACTURING METHOD OF SILICON CARBIDE SEMICONDUCTOR DEVICE

CROSS REFERENCE TO RELATED APPLICATIONS

This is a continuation application of International Application PCT/JP2014/071121 filed on Aug. 8, 2014 which claims priority from a Japanese Patent Application No. 2013-164798 filed on Aug. 8, 2013, the contents of which are incorporated herein by reference.

BACKGROUND OF THE INVENTION

1. Field of the Invention

The embodiment discussed herein is related to a manufacturing method of a silicon carbide semiconductor device.

2. Description of the Related Art

Among semiconductor devices conventionally used as power devices, those using silicon (Si) as a semiconductor material have become mainstream. Compared to silicon, silicon carbide (SiC) has a wider bandgap (hereinafter, wide gap semiconductor) and physical properties such as thermal conductivity that is 3 times that of silicon, critical electric field strength that is 10 times that of silicon, and electron drift velocity that is 2 times that of silicon. Therefore, the application of SiC for power devices capable of high temperature operation with low loss and for which the dielectric breakdown voltage is high, is being researched.

A vertical semiconductor device having a back surface electrode equipped with a low resistance ohmic electrode in the back surface side is a mainstream power device structure. Various materials and structures are used for the back surface electrode of a vertical semiconductor device. For instance, surface electrodes have been proposed that are respectively formed by stacked layers including a titanium (Ti) layer, a nickel (Ni) layer, and a silver (Ag) layer (for example, refer to Japanese Laid-Open Patent Publication No. 2007-184571); and a titanium layer, a nickel layer, and a gold layer (for example, refer to Japanese Laid-Open Patent Publication No. 2010-86999).

As a method of forming a back surface electrode of a vertical semiconductor device that uses SiC, a method has been proposed where a nickel layer is formed on a semiconductor substrate of silicon carbide (hereinafter, SiC substrate) and thereafter, the nickel layer is subjected to heat treatment to form a nickel silicide layer, whereby contact (electrical contact unit) of the SiC substrate and the nickel silicide layer is an ohmic contact (for example, refer to Japanese Laid-Open Patent Publication Nos. 2007-184571 and 2010-86999). Nonetheless, in Japanese Laid-Open Patent Publication Nos. 2007-184571 and 2010-86999, a problem arises in that the back surface electrode formed on the nickel silicide layer is prone to peeling from the nickel silicide layer.

To resolve such a problem, a method has been proposed where after the nickel layer remaining on the surface of the nickel silicide layer has been removed exposing the nickel silicide layer, the back surface electrode is formed by sequentially stacking on the nickel silicide layer, the titanium layer, the nickel layer, and the gold layer (for example, refer to Japanese Laid-Open Patent Publication No. 2008-53291). In Japanese Laid-Open Patent Publication No. 2008-53291, by forming the portion contacting the nickel silicide layer of the back surface electrode by a metal other than nickel, peeling of the back surface electrode can be suppressed. Further, even if a layer of deposited carbon (C) is formed on a surface of the nickel silicide layer, the layer including the carbon can be removed together with the nickel layer whereby, peeling of the back surface electrode is suppressed.

Further, as another method of forming a back surface electrode of a semiconductor device, a method has been proposed where residual metal carbide or carbon particles on the surface of the nickel silicide layer are removed by plasma etching and thereafter, a back surface electrode is formed on the nickel silicide layer (for example, refer to Japanese Laid-Open Patent Publication No. 2003-243323). Further, as a method of planarizing a surface of a semiconductor wafer, a method has been proposed that includes a machine processing process of machine processing a (000-1)C face of silicon carbide and a surface layer removing process of removing 0.1 μm or more of the surface layer of the silicon carbide by thermal oxidation using a substance containing oxygen atoms after the machine processing process (for example, refer to Japanese Patent No. 4539140).

Further, as a method of planarizing a surface of a semiconductor wafer, a method has been proposed where, a colloidal silica slurry including sodium hypochlorite and hydrogen peroxide solution, and having an oxidation-reduction potential at least 700 mV or more with respect to a standard hydrogen electrode together with a dissolved oxygen concentration of 20 mg/L or more is used as an oxidizing agent, the formed oxidized layer of the surface of the silicon carbide single crystal wafer is mechanically polished using a polishing surface pressure of 0.05 kg/cm² or greater and 0.20 kg/cm² or less, and removed (for example, refer to Japanese Patent No. 4846445). In Japanese Patent No. 4846445, final polishing is performed after the surface SiC is oxidized to change the SiC to SiOx having substantially the same hardness as colloidal silica.

Nonetheless, even when the techniques described in Japanese Patent Application Laid-Open Publication No. 2008-53291 or Japanese Patent Application Laid-Open Publication No. 2003-243323 are used to form a back surface electrode, a problem arises in that the adhesion of the nickel silicide layer and the titanium layer, which is the lowest layer of the back surface electrode, is low. For example, when the semiconductor wafer is diced into chips, the back surface electrode has been confirmed to peel from the nickel silicide layer. The reason for this is presumed to be as follows. According to Japanese Laid-Open Patent Publication No. 2007-184571, the nickel silicide layer is generated by a solid-phase reaction of silicon carbide and nickel, indicated below as equation (1).

$$Ni + 2SiC \rightarrow NiSi_2 + 2C \qquad (1)$$

Carbon resulting from the reaction of equation (1) is present dispersed throughout the nickel silicide layer as very fine deposits or in an over-saturated state in which the crystals are unstable. When heat treatment is performed after the nickel silicide layer is formed, the carbon dispersed through the nickel silicide layer is discharged all at once and is deposited (agglomerates) in a layer as deposits, such as graphite, on the surface of and inside the nickel silicide layer. These deposits of agglomerated carbon are brittle and have low adhesion; and consequently, even with the slightest stress, easily fracture, whereby the back surface electrode formed on the nickel silicide layer peels.

In a manufacturing process of a semiconductor device using SiC, after the nickel silicide layer is formed, various types of heat treatment are performed whereby, carbon of the SiC substrate diffuses and is deposited inside and on the surface of the nickel silicide layer. The carbon that is deposited on the surface of the nickel silicide layer can be removed by a process such as ion milling, enabling peeling of the back surface electrode consequent to the deposition of carbon on the surface of the nickel silicide layer to be prevented. However, removal of the carbon that is deposited inside the nickel silicide layer is extremely difficult and a problem arises in that the back surface electrode peels from portions where carbon has been deposited in a layer inside the nickel silicide layer.

SUMMARY OF THE INVENTION

To solve the problems above and achieve an object, the inventors found the following as a result of diligent, repeated research. FIGS. 8 and 9 are cross sectional views depicting states during the manufacture of a conventional silicon carbide semiconductor device. As depicted in FIG. 8, in the conventional technique, during back surface grinding of a SiC substrate 101, an altered layer 102 of a thickness of a few ten nm is formed in a surface layer of the SiC substrate 101. Inside the altered layer 102, carbon is uniformly distributed. It was found that in a state with the altered layer 102 formed as such, when various types of heat treatment are performed thereafter such as heat treatment to form a nickel silicide layer 103 and heat treatment to form a back surface electrode (not depicted), carbon agglomerates in a portion of the altered layer 102 and as depicted in FIG. 9, a stratified layer 104 including carbon is deposited inside a the nickel silicide layer 103. The present disclosure is based on such finding.

Further, to solve the problems above and achieve an object, a manufacturing method of a silicon carbide semiconductor device according to one aspect of the present invention includes grinding a back surface of a semiconductor substrate formed of silicon carbide and reducing a thickness of the semiconductor substrate; removing by any one among polishing and etching, an altered layer occurring in a surface layer of the back surface of the semiconductor substrate consequent to the grinding; forming a nickel film on the back surface of the semiconductor substrate after the removing of the altered layer; subjecting the nickel film to silicidation by a heat treatment and forming a nickel silicide layer; and forming a metal electrode on a surface of the nickel silicide layer.

According to another aspect of the manufacturing method of a silicon carbide semiconductor device, the polishing is chemical mechanical polishing.

According to yet another aspect of the manufacturing method of a silicon carbide semiconductor device, the etching is any one among dry etching and wet etching.

According to still another aspect of the manufacturing method of a silicon carbide semiconductor device, the removing includes reducing the thickness of the semiconductor substrate 100 nm or more.

According to a further aspect of the manufacturing method of a silicon carbide semiconductor device, the grinding includes growing an epitaxial layer on a front surface of the semiconductor substrate, the growing further includes growing a sublimation layer on the back surface of the semiconductor substrate, the grinding includes removing the sublimation layer and removing the surface layer of the back surface of the semiconductor substrate.

According to a further aspect of the manufacturing method of a silicon carbide semiconductor device, the metal electrode is formed by any one among sequential deposition of a titanium (Ti) film, a nickel (Ni) film and a silver (Ag) film, and sequential deposition of a titanium (Ti) film, a nickel (Ni) film and a gold (Au) film.

The other objects, features, and advantages of the present invention are specifically set forth in or will become apparent from the following detailed description of the invention when read in conjunction with the accompanying drawings.

BRIEF DESCRIPTION OF THE DRAWINGS

FIGS. 2, 3, 4, 5, 6, and 7 are cross-sectional views schematically depicting states during the manufacture of a silicon carbide semiconductor device according to the embodiment.

DETAILED DESCRIPTION OF THE PREFERRED EMBODIMENTS

Figure 1:
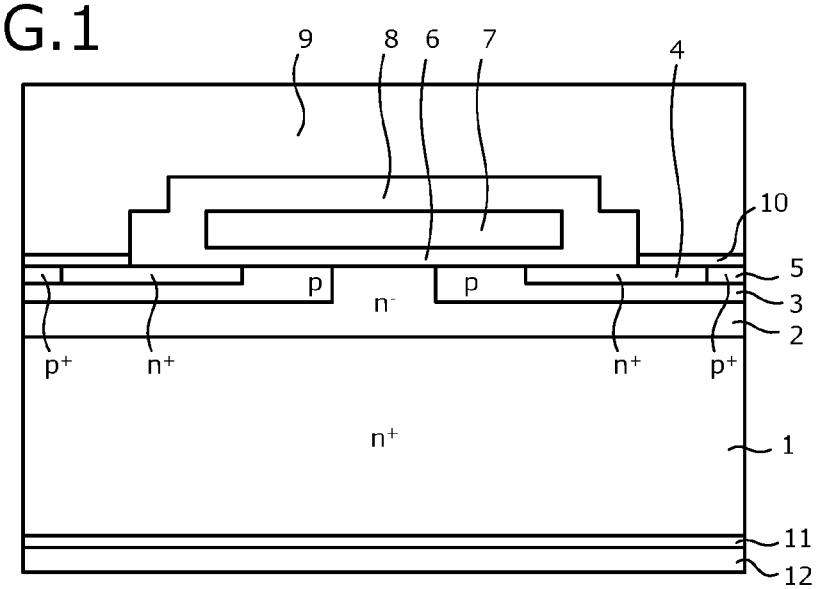
FIG. 1 is a cross-sectional view of one example of a silicon carbide semiconductor device manufactured by a manufacturing method of a silicon carbide semiconductor device according to an embodiment.

Preferred embodiments of a manufacturing method of a silicon carbide semiconductor device will be described in detail with reference to the accompanying drawings. In the present specification and the accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not repeatedly be described.

EMBODIMENT

Concerning a structure of a silicon carbide semiconductor device produced (manufactured) by the manufacturing method of a silicon carbide semiconductor device according to an embodiment, a vertical insulated gate field effect transistor (MOSFET) will be described as an example. FIG. 1 is a cross-sectional view of one example of a silicon carbide semiconductor device manufactured by the manufacturing method of a silicon carbide semiconductor device according to the embodiment. As depicted in FIG. 1, in a silicon carbide semiconductor device according to the embodiment, on a front surface of an $n^+$ type semiconductor substrate (hereinafter, $n^+$-type SiC substrate) 1 formed of silicon carbide (SiC), an $n^-$-type SiC epitaxial layer 2 is formed. On a surface layer of a surface of the $n^-$-type SiC epitaxial layer 2, on the opposite side of the $n^-$-type SiC epitaxial layer 2 with respect to the $n^+$-type SiC substrate 1 side of the $n^-$-type SiC epitaxial layer 2, a p-type base layer 3 is selectively provided. Inside the p-type base layer 3, an $n^+$-type source layer 4 and a $p^+$-type contact layer 5 are selectively provided. The $n^+$-type source layer 4 and the $p^+$-type contact layer 5 contact each other.

On a surface of a portion of the p-type base layer 3 between the $n^-$-type SiC epitaxial layer 2 and the $n^+$-type source layer 4, a gate electrode 7 is provided via a gate insulating film 6. A source electrode 9 is provided to contact the $n^+$-type source layer 4 and the $p^+$-type contact layer 5 via a nickel silicide layer 10, and to be electrically insulated from the gate electrode 7 by an interlayer insulating film 8.

A contact (electrical contact unit) of a SiC portion (the n$^+$-type source layer 4 and the p$^+$-type contact layer 5) and the nickel silicide layer 10 is an ohmic contact. In a back surface of the n$^+$-type SiC substrate 1, a nickel silicide layer 11 is provided. A contact of the n$^+$-type SiC substrate 1 and the nickel silicide layer 11 is an ohmic contact. A back surface electrode 12, which is a drain electrode, contacts the nickel silicide layer 11.

Figure 2:
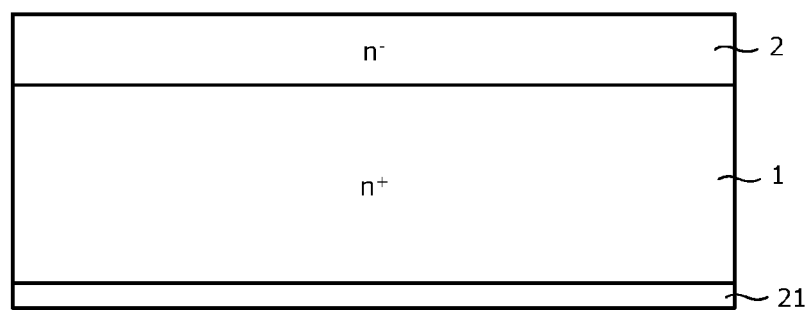
Figure 3:
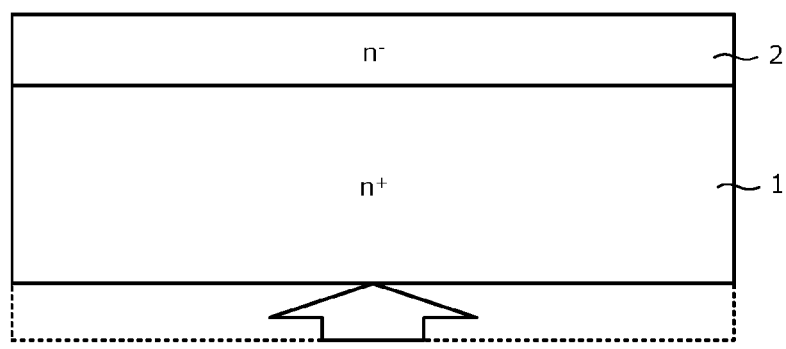

The manufacturing method of a silicon carbide semiconductor device according to the embodiment will be described. FIGS. 2, 3, 4, 5, 6, and 7 are cross-sectional views schematically depicting states during the manufacture of a silicon carbide semiconductor device according to the embodiment. As depicted in FIG. 2, on the front surface of the n$^+$-type SiC substrate (semiconductor wafer) 1, for example, the n$^-$-type SiC epitaxial layer 2 of a 15 μm thickness is epitaxially grown. At this time, on the back surface of the n$^+$-type SiC substrate 1, for example, a n$^-$-type SiC sublimation layer (hereinafter, back surface n$^-$-type SiC sublimation layer) 21 of a 3 μm thickness is grown. The back surface n$^-$-type SiC sublimation layer 21 is a layer having a lower impurity concentration than that of the n$^+$-type SiC substrate 1 and is not necessary in the completed silicon carbide semiconductor device. Therefore, as depicted in FIG. 3, after the back surface n$^-$-type SiC sublimation layer 21 is removed by grinding, the exposed back surface of the n$^+$-type SiC substrate 1 is polished.

More specifically, for example, using an abrasive wheel having abrading grains of a grit size of about #2000, the back surface n$^-$-type SiC sublimation layer 21 is roughly ground from the back surface side of the n$^+$-type SiC substrate 1 to reduce the thickness of the n$^+$-type SiC substrate 1, about 20 μm, including the thickness of the back surface n$^-$-type SiC sublimation layer 21, for example. Next, for example, using an abrasive wheel having abrading grains of a grit size of about #7000, finish grinding is performed on the roughly ground back surface of the n$^+$-type SiC substrate 1 to further reduce the thickness of the n$^+$-type SiC substrate 1 about 5 μm, for example. The reason for such extensive grinding up to the surface layer of n$^+$-type SiC substrate 1 and exceeding the thickness of the back surface n$^-$-type SiC sublimation layer 21 is that even in cases where the n$^+$-type SiC substrate 1 is warped or there are differences in grinding thickness, the back surface n$^-$-type SiC sublimation layer 21 can be completely removed. The grit size of the abrading grains, for example, is a size within a range described in a table of grit sizes of abrading materials for abrasive wheels (Bonded Abrasive Grain Sizes) defined under Japanese Industrial Standard (JIS) R6001:1998.

Surface roughness Ra of the finish-ground back surface of the n$^+$-type SiC substrate 1 is 3 nm, which is large. Further, in the surface layer of the finish-ground back surface of the n$^+$-type SiC substrate 1, an altered layer (not depicted) in which the crystalline structure is disturbed occurs having a thickness of, for example, about 70 nm from the ground surface. Inside this altered layer, carbon is uniformly distributed. When the altered layer occurs inside the n$^+$-type SiC substrate 1, consequent to heat treatment thereafter, carbon is prone to be deposited in a layer in a portion where the altered layer occurs. Therefore, after the back surface of the n$^+$-type SiC substrate 1 is finish-ground, the finish-ground back surface of the n$^+$-type SiC substrate 1, for example, is chemical mechanical polished (CMP) and the thickness of the n$^+$-type SiC substrate 1 is further reduced about 100 nm or more, whereby the altered layer that formed in the surface layer of the back surface of the n$^+$-type SiC substrate 1 is removed. The surface roughness Ra of the back surface of the n$^+$-type SiC substrate 1 after CMP is preferably, for example, 0.1 nm or less. The total thickness of the n$^+$-type SiC substrate 1 and the n$^-$-type SiC epitaxial layer 2 before grinding and polishing is determined such that the thickness of the product after grinding and polishing remains.

Next, as depicted in FIG. 4, ion implantation of a p-type impurity for forming the p-type base layer 3, ion implantation of an n-type impurity for forming the n$^+$-type source layer 4, and ion implantation of a p-type impurity for forming the p$^+$-type contact layer 5 are sequentially performed; and the p-type base layer 3, n$^+$-type source layer 4, and the p$^+$-type contact layer 5 are formed inside the n$^-$-type SiC epitaxial layer 2. The sequence of the ion implantation of an n-type impurity for forming the n$^+$-type source layer 4 and the ion implantation of a p-type impurity for forming the p$^+$-type contact layer 5 may be interchanged. Next, for example, heat treatment at 1800 degrees C. is performed, and the impurities implanted to form the p-type base layer 3, the n$^+$-type source layer 4, and the p$^+$-type contact layer 5 are activated.

Next, as depicted in FIG. 5, on the entire surface of the n$^-$-type SiC epitaxial layer 2, the gate insulating film 6 is formed. Next, after an impurity-doped polysilicon film is deposited on the gate insulating film 6, the polysilicon film is patterned and the gate electrode 7 is formed. Next, after the interlayer insulating film 8 is formed to cover the gate electrode 7, the interlayer insulating film 8 and the gate insulating film 6 are selectively removed, whereby a contact hole 22 that exposes the n$^+$-type source layer 4 and the p$^+$-type contact layer 5 is formed. Next, as depicted in FIG. 6, a nickel film is formed on the entire back surface of the n$^+$-type SiC substrate 1 after the CMP and on the surface of the silicon portion (the n$^+$-type source layer 4 and the p$^+$-type contact layer 5) exposed by the contact hole 22.

Next, for example, the nickel films formed on the substrate front surface side and back surface side are subject to silicidation by rapid heat treatment (RTA), and the nickel silicide layers 10, 11 are formed on the surface of the silicon portion exposed by the contact hole 22 and on the entire polished back surface of the n$^+$-type SiC substrate 1, respectively. As a result, contact of the silicon portion exposed by the contact hole 22 and the nickel silicide layer 10, and contact of the n$^+$-type SiC substrate 1 and the nickel silicide layer 11 are ohmic contacts. Next, on the surface of the nickel silicide layer 10 on the front surface side of the n$^+$-type SiC substrate 1, an aluminum film is deposited and the source electrode 9 is formed. Meanwhile, on the surface of the nickel silicide layer 11 on the back surface side of the n$^+$-type SiC substrate 1, a titanium (Ti) film, a nickel (Ni) film, and a silver (Ag) film are sequentially deposited and the back surface electrode 12 is formed. In place of the silver (Ag) film, a gold (Au) may be deposited, or an alloy that includes silver, gold, etc. may be deposited. Further, the nickel (Ni) film may also be an alloy of nickel and vanadium (V). Thereafter, the semiconductor wafer (epitaxial wafer formed by stacking of the n$^-$-type SiC epitaxial layer 2 on the n$^+$-type SiC substrate 1) is cut (diced) into chip-shapes whereby, the vertical MOSFET depicted in FIG. 1 is completed.

Figure 7:
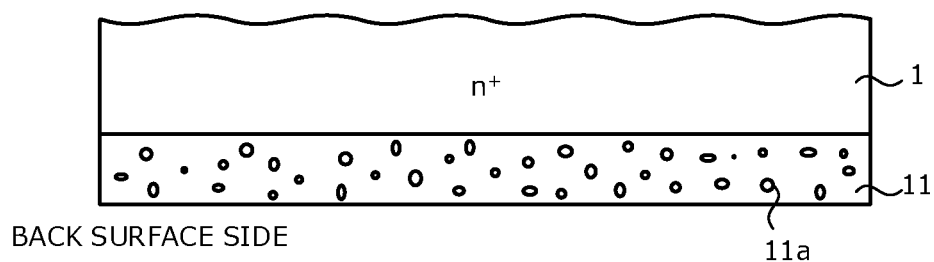
Figure 8:
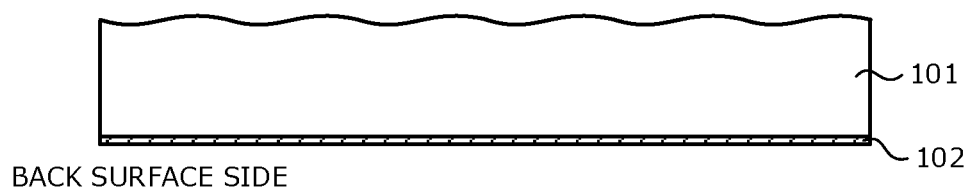
FIGS. 8 and 9 are cross sectional views depicting states during the manufacture of a conventional silicon carbide semiconductor device.
Figure 9:
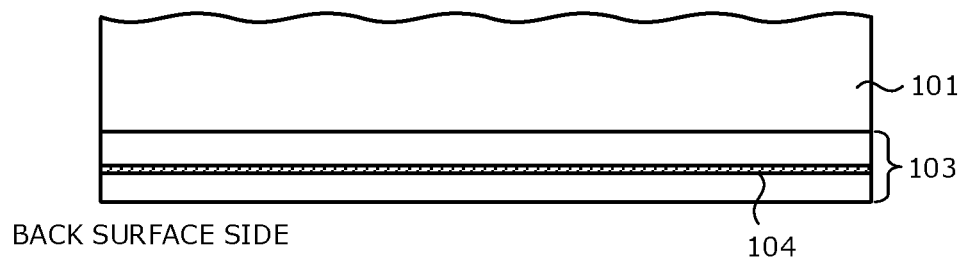

As described, an altered layer that occurs in the surface layer of the ground back surface of the n$^+$-type SiC substrate 1 is removed before the nickel silicide layer 11 is formed on the back surface of the n$^+$-type SiC substrate 1. Therefore, as depicted in FIG. 7, even when various types of heat treatment (e.g., heat treatment for forming the nickel silicide layer 11, heat treatment for forming the source electrode 9, the back surface electrode 12, etc.) are performed after the altered layer is removed, when the nickel silicide layer 11 is formed, carbon (refer to equation (1)) 11a occurring inside the nickel silicide layer 11 is uniformly distributed inside the nickel silicide layer 11 and does not agglomerate. Thus, inside the nickel silicide layer 11, the carbon does not agglomerate to form brittle deposits having low adhesion and therefore, peeling of the back surface electrode 12 caused by carbon included inside the nickel silicide layer 11 can be prevented.

As described, according to the embodiment, by removing by polishing, an altered layer occurring in the ground surface layer of the n$^+$-type SiC substrate, the deposition of agglomerated carbon inside the nickel silicide layer consequent to subsequent heat treatment can be prevented. As a result, for example, when the semiconductor wafer is diced into chips, peeling of the back surface electrode caused by the carbon included inside the nickel silicide layer can be prevented. Therefore, peeling of the back surface electrode can be sufficiently suppressed, enabling the yield ratio to be improved.

In the description above, although the present disclosure is described taking a MOSFET as an example, without limitation hereto, application may be to other semiconductor devices that use SiC such as insulated-gate bipolar transistors (IGBT), diodes, and the like. In the described embodiment, although description is given taking a case where an altered layer occurring in the surface layer of the ground back surface of the n$^+$-type SiC substrate is removed by CMP, without limitation hereto, the altered layer may be removed by dry etching, wet etching, etc. Further, in the described embodiment, although description is given using the epitaxial substrate of the n$^-$-type SiC epitaxial layer stacked on the n$^+$-type SiC substrate, without limitation hereto, an n$^+$-type SiC substrate equivalent in thickness to the described epitaxial substrate may be used. The present disclosure is further applicable in cases where the conductivity types (n-type, p-type) of the semiconductor layer or the semiconductor region are reversed in the described embodiment.

As described, by removing by polishing or etching, an altered layer occurring in the ground surface layer of the SiC substrate, the deposition of agglomerated carbon inside the nickel silicide layer consequent to subsequent heat treatment can be prevented. As a result, for example, when the semiconductor wafer is diced into chips, peeling of the back surface electrode caused by carbon included inside the nickel silicide layer can be prevented.

The manufacturing method of a silicon carbide semiconductor device according the present disclosure achieves an effect in that peeling of the back surface electrode can be suppressed.

As described, the manufacturing method of a silicon carbide semiconductor device according to the present disclosure is useful for power semiconductor devices equipped with a metal electrode forming an ohmic contact with a silicon carbide semiconductor.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a silicon carbide semiconductor device, comprising:
   forming a silicon carbide epitaxial layer on a front surface of a semiconductor substrate formed of silicon carbide:
   after said forming a silicon carbide epitaxial layer, grinding a back surface of the semiconductor substrate to reduce thickness thereof and provide an altered layer that is ground;
   removing by polishing or etching, the altered layer from the back surface;
   forming a nickel film on the back surface of the semiconductor substrate after removing the altered layer;
   heat treating the nickel film to forming a nickel silicide layer by silicidation; and
   forming a metal electrode on a surface of the nickel silicide layer.

2. The method of manufacturing a silicon carbide semiconductor device according to claim 1, wherein polishing is accomplished by chemical-mechanical polishing.

3. The method of manufacturing a silicon carbide semiconductor device according to claim 1, wherein etching is accomplished by dry etching or wet etching.

4. The method of manufacturing a silicon carbide semiconductor device according to claim 1, wherein removing includes reducing the thickness of the semiconductor substrate 100 nm or more.

5. The method of manufacturing a silicon carbide semiconductor device according to claim 1, wherein grinding the back surface of the semiconductor substrate includes growing an epitaxial layer on a front surface of the semiconductor substrate,
   wherein growing further includes growing a sublimation layer on the back surface of the semiconductor substrate, and
   wherein grinding includes removing the sublimation layer and removing the surface layer of the back surface of the semiconductor substrate.

6. The method of manufacturing a silicon carbide semiconductor device according to claim 1, wherein the metal electrode is formed by one of sequential deposition of a titanium film, a nickel film and a silver film, and sequential deposition of a titanium film, a nickel film and a gold film.

* * * * *